(12) United States Patent
Seidemann et al.

(10) Patent No.: US 7,682,958 B2
(45) Date of Patent: Mar. 23, 2010

(54) METHOD FOR PRODUCING AN INTEGRATED CIRCUIT INCLUDING A FUSE ELEMENT, A FUSE-MEMORY ELEMENT OR A RESISTOR ELEMENT

(75) Inventors: Georg Seidemann, Landshut (DE); Reinhard Goellner, Regensburg (DE)

(73) Assignee: Infineon Technologies AG, Neubiberg (DE)

( * ) Notice: Subject to any disclaimer, the term of this patent is extended or adjusted under 35 U.S.C. 154(b) by 85 days.

(21) Appl. No.: 11/831,520

(22) Filed: Jul. 31, 2007

(65) Prior Publication Data
US 2008/0029477 A1    Feb. 7, 2008

(30) Foreign Application Priority Data
Aug. 1, 2006   (DE) ................. 10 2006 035 875

(51) Int. Cl.
*H01L 21/44* (2006.01)
(52) U.S. Cl. .................. 438/601; 257/209; 257/529; 257/E23.149; 257/E21.592; 257/E23.15
(58) Field of Classification Search ............... 438/601; 257/209, 529
See application file for complete search history.

(56) References Cited

U.S. PATENT DOCUMENTS

| | | | | |
|---|---|---|---|---|
| 5,070,392 | A * | 12/1991 | Coffey et al. | 257/758 |
| 5,340,775 | A * | 8/1994 | Carruthers et al. | 438/601 |
| 6,372,555 | B1 | 4/2002 | Lee et al. | |
| 6,577,009 | B1 * | 6/2003 | You et al. | 257/751 |
| 2003/0164908 | A1 * | 9/2003 | Wang | 349/113 |
| 2004/0131976 | A1 * | 7/2004 | Hsu | 430/311 |

FOREIGN PATENT DOCUMENTS

DE   102004019609   12/2005

* cited by examiner

*Primary Examiner*—Ha Tran T Nguyen
*Assistant Examiner*—Aaron A Dehne
(74) *Attorney, Agent, or Firm*—Dicke, Billig & Czaja, PLLC

(57) ABSTRACT

A method for producing an integrated circuit including a fuse element, a fuse-memory element or a resistor element is disclosed. In one embodiment, at least one metallization layer is applied onto a substrate. A hard mask is applied onto the at least one metallization layer. The at least one metallization layer is wet chemically etched by using the hard mask and the fuse element. The fuse-memory element or the resistor element is formed in a region in which the at least one metallization layer has been etched.

17 Claims, 5 Drawing Sheets

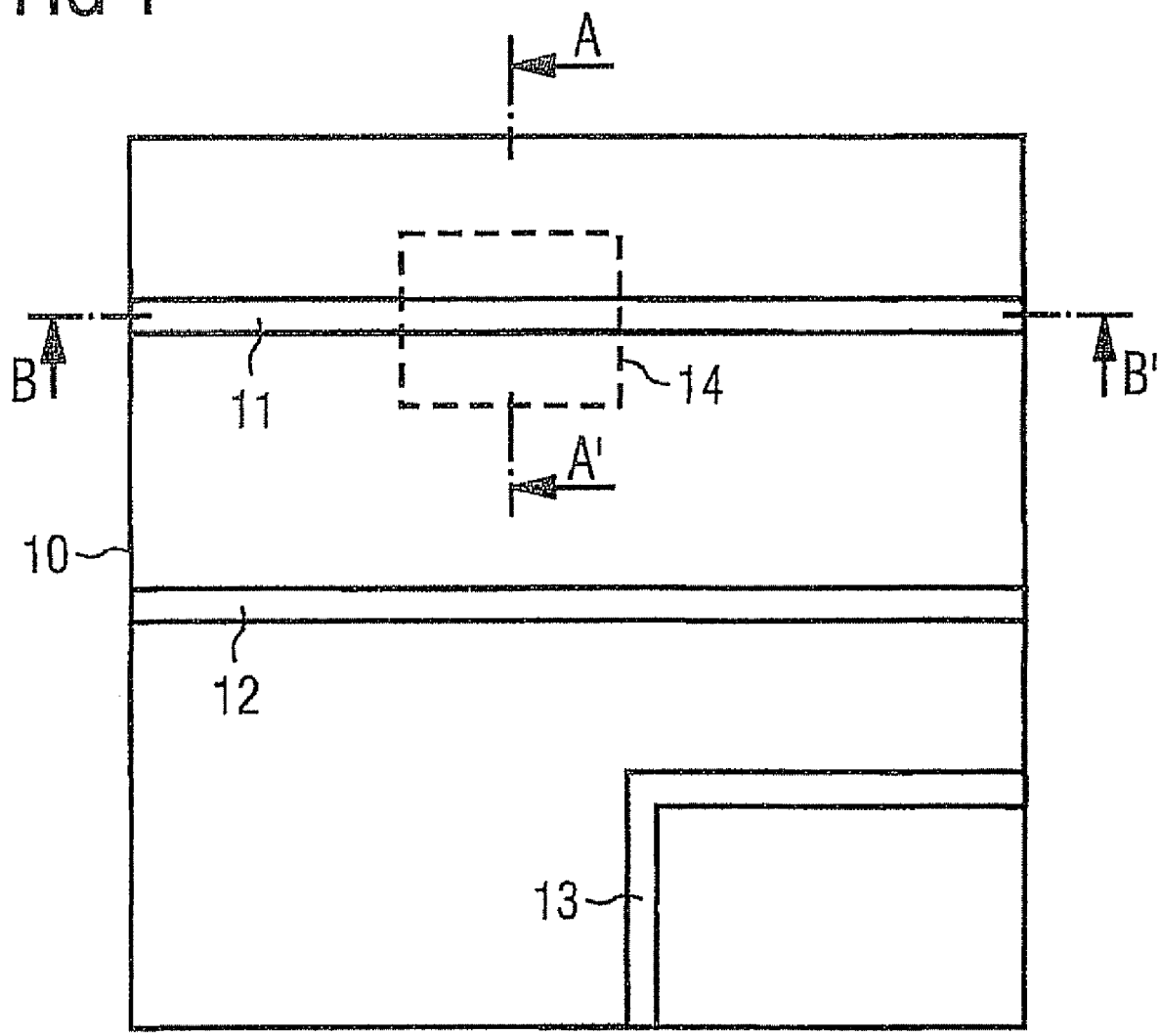

FIG 2A A-A'
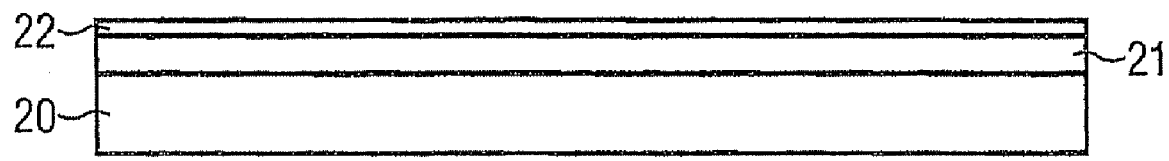
FIG 2B A-A'
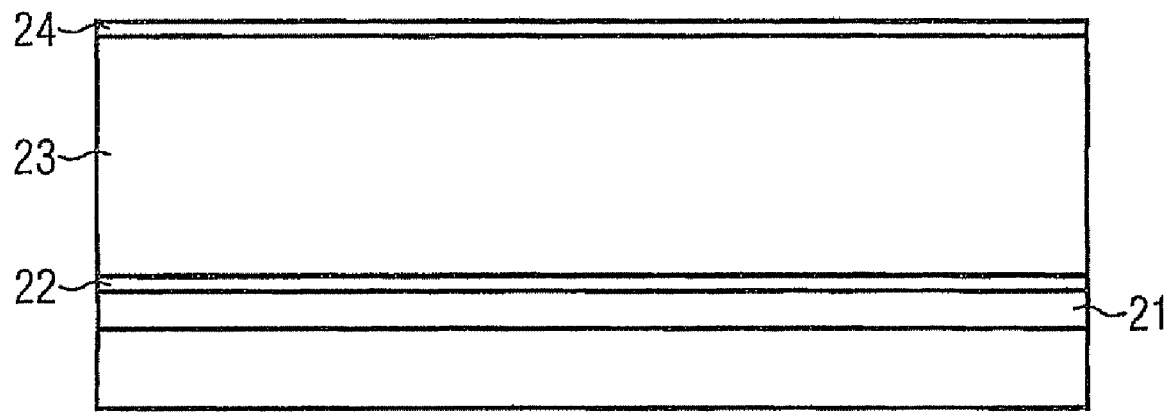
FIG 2C A-A'
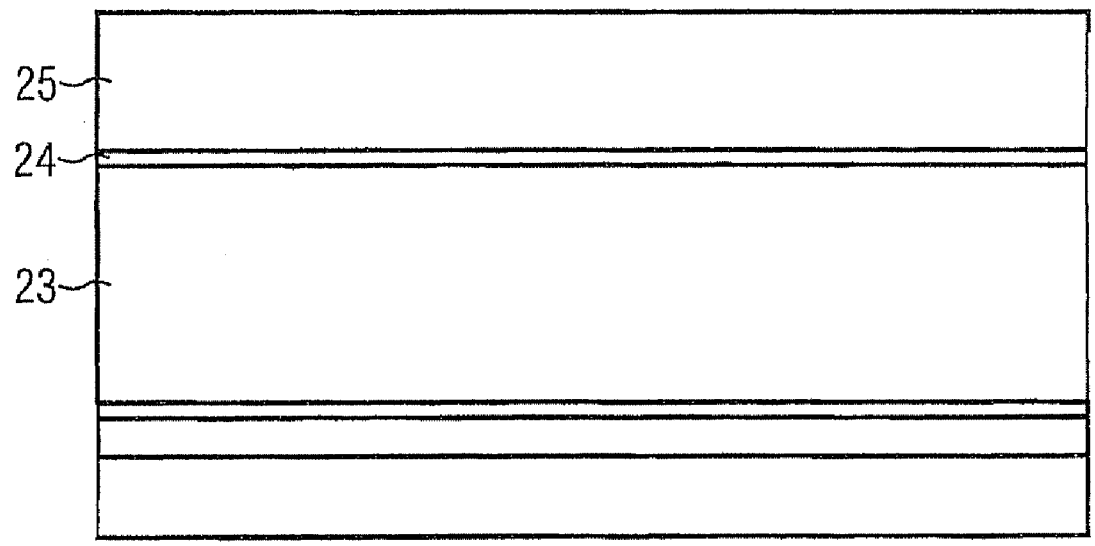

FIG 2D  A-A'
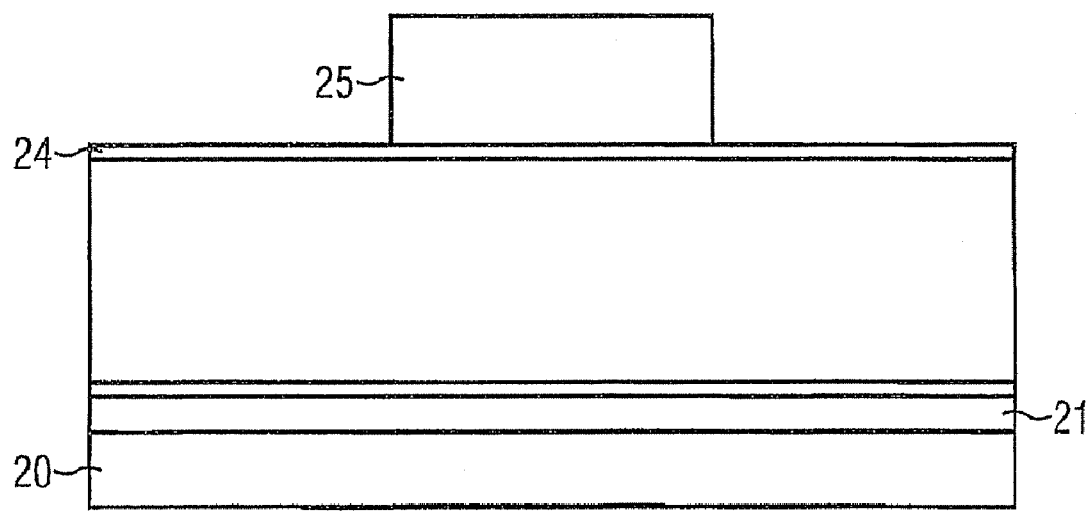
FIG 2E  A-A'
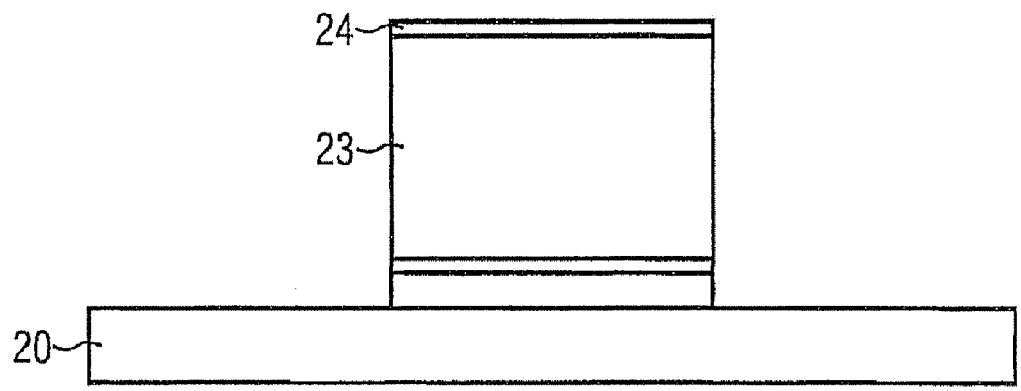
FIG 2F  A-A'
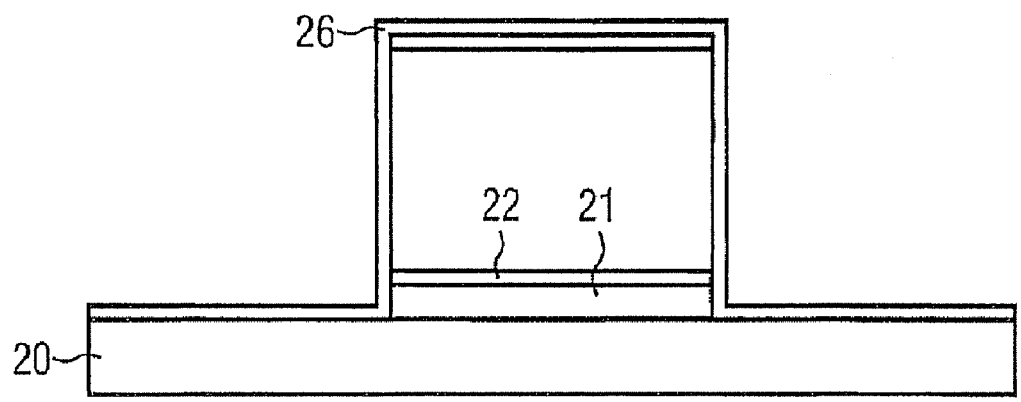

FIG 2G  B-B'
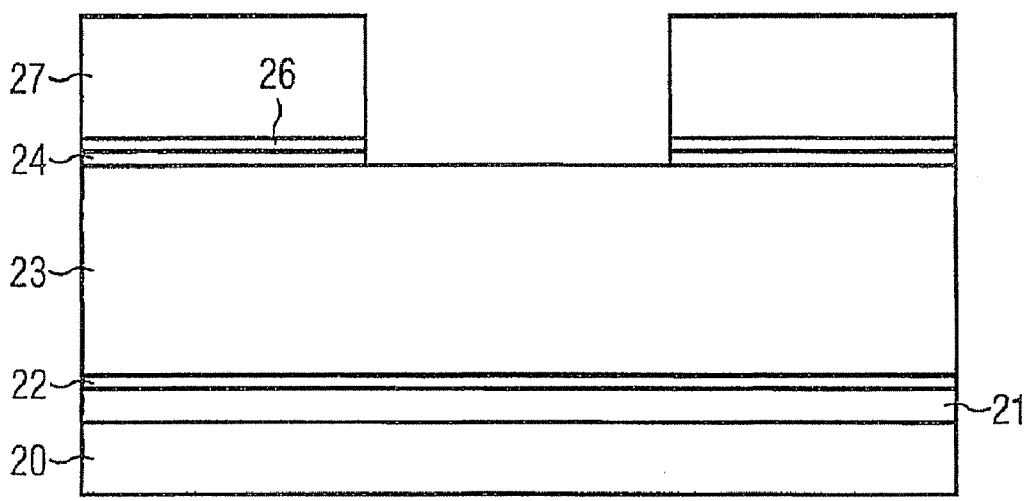
FIG 2H  B-B'
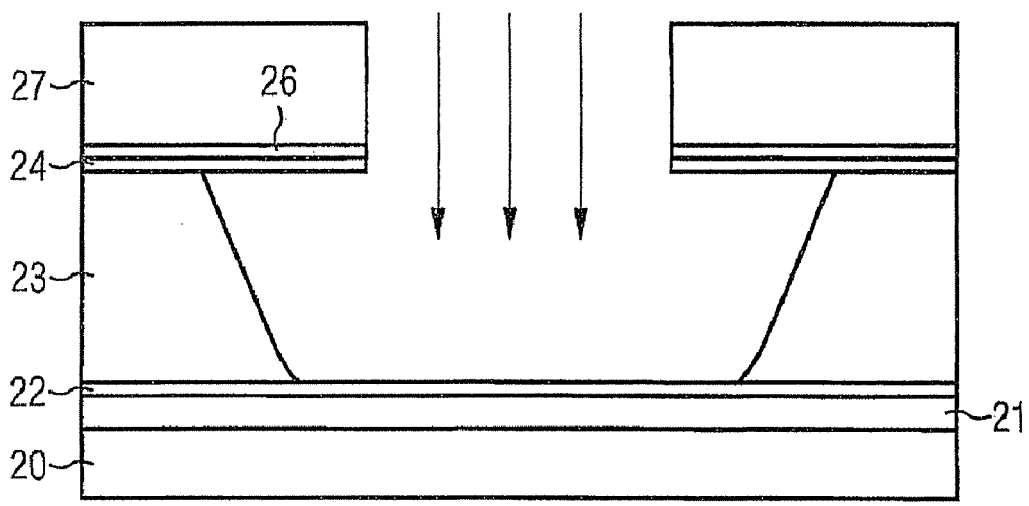
FIG 2I  B-B'
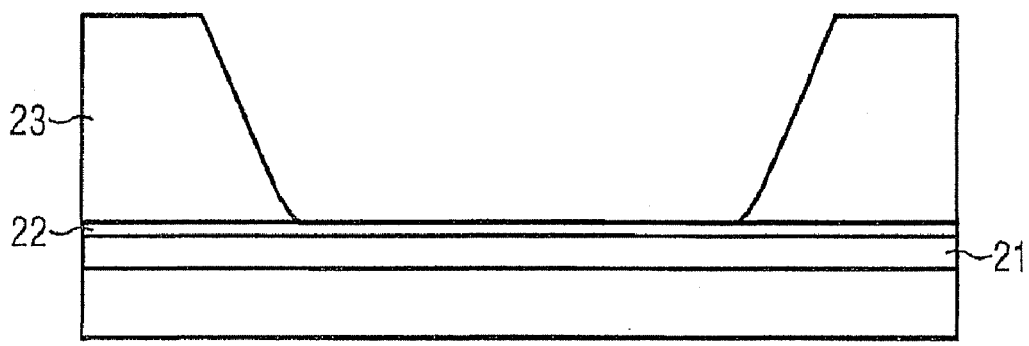

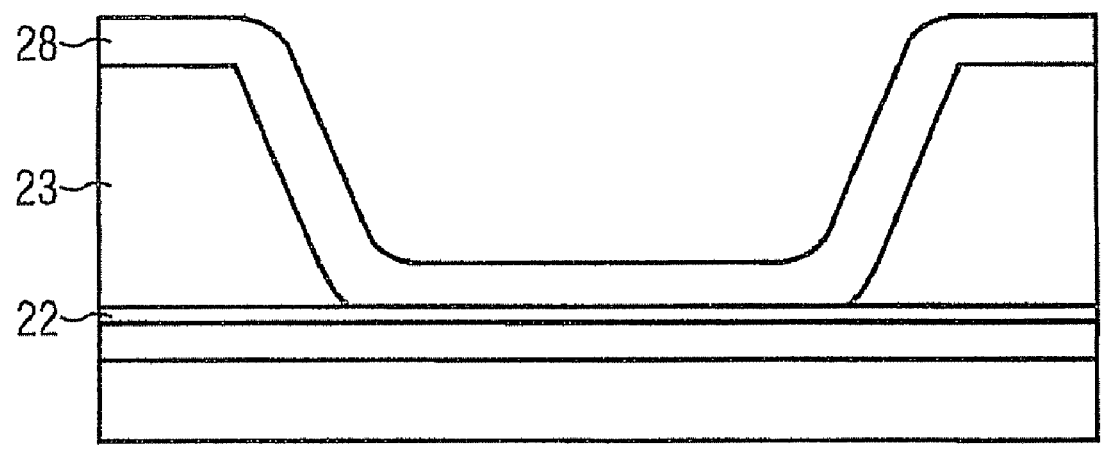
FIG 2J  B-B'
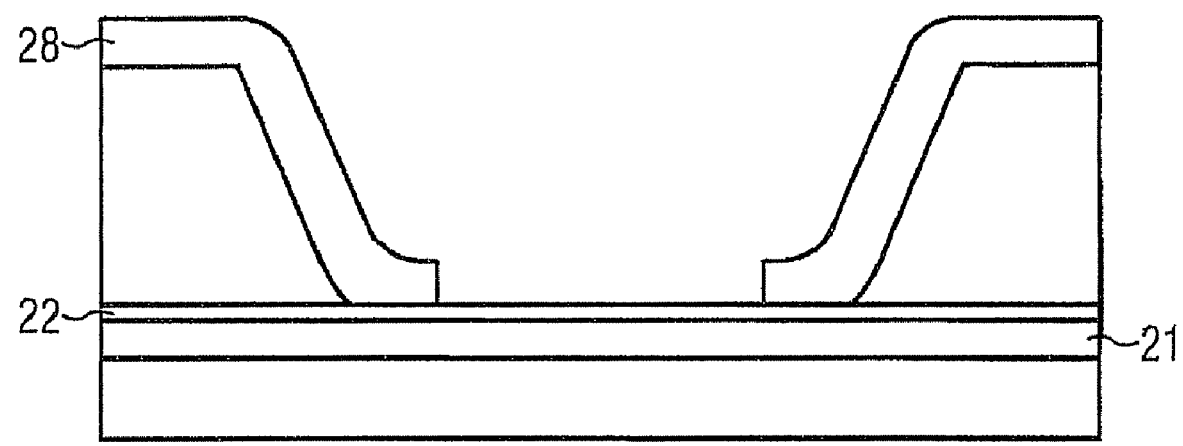
FIG 2K  B-B'

US 7,682,958 B2

METHOD FOR PRODUCING AN INTEGRATED CIRCUIT INCLUDING A FUSE ELEMENT, A FUSE-MEMORY ELEMENT OR A RESISTOR ELEMENT

CROSS-REFERENCE TO RELATED APPLICATIONS

This Utility patent application claims priority to German Patent Application No. DE 10 2006 035 875.9 filed on Aug. 1, 2007, which is incorporated herein by reference.

BACKGROUND

The invention relates to a method for producing an integrated circuit including a fuse element, a fuse-memory element or a resistor element.

Fuse-memory elements are used for the nonvolatile storage of binary information. A fuse-memory element includes an electrically conductive connection, for example a metal-metal connection, with a low junction resistance. The programming state of the fuse-memory element is modified by at least partially cutting the electrically conductive connection. The two programming states of the fuse-memory element are therefore characterized respectively by a low junction resistance and a high junction resistance of the fuse-memory element.

The electrically conductive connection of a fuse-memory element will be melted when required either by applying a current or by the action of a laser beam. Depending on the method the fuse-memory elements, by using which the respective connections can be cut, will be referred to as electrical fuse-memory elements or as laser fuse-memory elements.

In the German technical literature, the terms "melt bridges", "cuttable melt bridges" or "fusible links" are occasionally used for fuse-memory elements. The term "fuse" is however much more common in the German technical literature. Fuse-memory elements will therefore be referred to below.

For these and other reasons, there is a need for the present invention.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

FIG. 1 illustrates a schematic representation of a detail of a circuit in a plan view.

FIGS. 2A to 2K illustrate schematic representations to illustrate a method for producing a fuse-memory element or a resistor element as an exemplary embodiment.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

It is to be understood that the features of the various exemplary embodiments described herein may be combined with each other, unless specifically noted otherwise.

One embodiment provides a method for producing an integrated circuit including a fuse-memory element or a resistor element.

According to one embodiment, in a method for producing a component at least one metallization layer is applied at least locally onto a substrate. A hard mask is applied onto the metallization layer. The at least one metallization is wet chemically etched by using the hard mask. A fuse element, a fuse-memory element or a resistor element is formed in a region in which the at least one metallization layer has been etched.

An opening of the hard mask, through which the at least one metallization layer is etched, is for example smaller than 10 µm or 9 µm or 8 µm or 7 µm or 6 µm or 5 µm or 4 µm or 3 µm or 2 µm or 1 µm in a first direction.

FIG. 1A illustrates by way of example a detail of a circuit 10 in a plan view. In one embodiment, circuit 10 is an integrated circuit. The circuit 10 includes a substrate, on which various conductor tracks 11, 12 and 13 are arranged. According to a first exemplary embodiment of the invention, the conductor track 11 is formed as a fuse element or as a fuse-memory element in a region 14 denoted by dashed lines. According to a second embodiment of the invention, the region 14 of the conductor track 11 includes an increased electrical resistance compared with the rest of the conductor track 11.

The production of the conductor track 11, which includes a fuse-memory element or an increased resistance in one section, will be described below with the aid of FIGS. 2A to 2K. FIGS. 2A to 2F illustrate cross sections of the conductor track along the line A-A' indicated in FIG. 1. FIGS. 2G to 2K illustrate cross sections of the conductor track along the line B-B' indicated in FIG. 1, which represents the principal direction of the conductor track 11 in the region 14. All the lengths and length ratios represented in FIGS. 1 and 2 are not true to scale.

FIG. 2A illustrates a substrate 20 which is formed for example as a semiconductor body, in particular as a wafer. The substrate 20 may however also be a ceramic, a PCB or any body having an insulating surface which is as planar as possible. A metallization layer 21, which consists for example of aluminium or gold or an alloy of one of the metals, is applied onto the substrate 20. Copper or aluminium-copper could also be envisaged as materials for the metallization layer 21. The metallization layer 21 is, for example, applied onto the substrate 20 by using a CVD (chemical vapour deposition) or PVD (physical vapour deposition) method. In these methods, particles of the material to be applied are chemically or physically deposited on the substrate 20 from the gas phase.

An etch stop layer 22, which is used to spatially limit the etching process during the wet chemical etching process described below, is applied onto the metallization layer 21. The etch stop layer 22 consists of an electrically conductive material and is resistant to the liquid etchant with which the etching process is carried out. For example, titanium nitride or tungsten is used as a material for the etch stop layer 22. For example, the aforementioned CVD and PVD methods are suitable as methods for depositing the etch stop layer 22.

A further metallization layer 23, which is formed for example by the same material as the metallization layer 21, is deposited on the etch stop layer 22 (cf. FIG. 2B). In the present exemplary embodiment, the metallization layer 23 is thicker than the underlying metallization layer 21.

An antireflection layer 24, which reduces the reflection of incident radiation into the overlying photoresist layer during a photolithographic method to be carried out later, is advantageously applied onto the metallization layer 23. The antireflection layer 24 reduces photolithographic imaging errors, so that the photolithographic method makes it possible to produce structures with a structure size of from less than 1 μm down to less than 100 nm. For example, the antireflection layer 24 consists of titanium nitride.

In a further method process, the layers applied onto the substrate 20 are structured in order to obtain the lateral structures of the conductor tracks 11, 12 and 13 as illustrated in FIG. 1. To this end, a mask is first produced from a photoresist layer 25 on the antireflection layer 24. The photoresist layer 25 is applied onto the antireflection layer 24 by using a spin coating (cf. FIG. 2C) and a predetermined mask structure is formed on the photoresist layer 25 in an exposure process. The photoresist layer 25 is subsequently developed. A structured photoresist layer 25, as represented in FIG. 2D, is obtained by the described photolithographic method.

The structured photoresist layer 25 is used as a mask in an etching process, by which the layers lying below the photoresist layer 25 are structured. By using a dry etching method, for example an RIE (reactive ion etching) method, the previously applied layers are removed down to the substrate 20 at the positions not covered by the photoresist 25. The result of this method process is represented in FIG. 2E.

In a further method process, a hard mask is applied onto the structure obtained on the substrate 20. To this end, for example by using a PECVD (plasma enhanced chemical vapour deposition) method, a mask layer 26 is deposited from a plasma on the substrate 20 (cf. FIG. 2F). The effect of the isotropic deposition of the mask layer 26 from the plasma is that the mask layer 26 also covers the side walls of the conductor track 11. For example, nitrides, oxynitrides, silicon nitride, silicon oxynitride, silicon carbide or amorphous silicon are suitable as materials for the mask layer 26. Furthermore, it is also conceivable to deposit first an oxide layer and then a nitride layer on the substrate 20.

FIG. 2G illustrates the production of the hard mask from the mask layer 26, FIG. 2G and the subsequent figures representing the structure obtained on the substrate 20 in cross section along the line B-B' illustrated in FIG. 1. In order to produce the hard mask, a photoresist layer 27 is first spin-coated onto the mask layer 26 and structured by using a photolithographic method. The mask layer 26 and the antireflection layer 24 are subsequently etched by using a dry etching method, for example an RIE method, in the regions in which the photoresist has been removed from the surface of the mask layer 26 by the photolithographic method. The result of this method process is illustrated in FIG. 2G. The surface of the structure applied onto the substrate 20 now includes regions in which the surface of the metallization layer 23 is exposed. All other regions of the metallization layer 23 are covered by the mask layer 26.

The structured mask layer 26 is used as a hard mask for the subsequent wet chemical etching process. The structure illustrated in FIG. 2G is exposed to a liquid etchant, so that the metallization layer 23 is removed in the regions left free by the hard mask 26. The etchant is selected so that it attacks the material of the metallization layer 23, but not the etch stop layer 22 and the mask layer 26. For example, phosphoric acid may be used as an etchant. Phosphoric acid etches aluminium but not titanium nitride.

As illustrated in FIG. 2H, it is inevitable that regions of the metallization layer 23 which lie in the edge region of the openings of the hard mask and below the mask layer 26 will also be removed during the wet etching process. The reason for this is that the liquid etchant can penetrate a little way below the mask layer 26 in a lateral direction. The penetration of the etchant into these regions of the metallization layer 23 can be controlled via the period of time for which the metallization layer 23 is exposed to the etchant. The shorter the etching time is, the less the etchant penetrates into the regions covered by the mask layer 26. The etching layer must, however, be at least long enough to ensure etching of the metallization layer 23 in the region of the openings of the hard mask down to the etch stop layer 22. The metallization layer 23 must be removed in this region so that the thickness of the remaining metallization is determined by the thickness of the metallization layer 21. The thickness of the fuse element, the fuse-memory element or the resistor element, which is intended to be formed in the etched region, can therefore be established a priori by selecting the thickness of the metallization layer 21.

It is conceivable for the etch stop layer 22 to be burnt and thereby removed in the region in which the metallization layer 23 has been etched away.

As an alternative to the procedure described above, it is also conceivable to obviate the etch stop layer 22 and control the etching of the metallization layer 23 merely via the etching time. The etching time must in this case be selected so that the etchant penetrates to the desired depth into the metallization layer 23. Instead of the two metallization layers 21 and 23, a single metallization layer may in this case be applied with a corresponding thickness onto the substrate 20.

After the metallization layer 23 has been etched, the photoresist layer 27, the mask layer 26 and the antireflection layer 24 are removed, for example in a dry or wet etching process. The result is represented in FIG. 2I. In the region in which the wet chemical etching has been carried out, the conductor track 11 now includes only the metallization layer 21 as a single metallization layer. In the other regions, the conductor track 11 includes the metallization layers 21 and 23 which are connected to one another by the electrically conductive etch stop layer 22. The region of the conductor track 11 in which the metallization has been thinned may be used as a fuse element, as a fuse-memory element or as a high-impedance resistor element, for example in an integrated circuit.

In order to protect against mechanical or chemical damage, the structure applied onto the substrate 10 may be coated with a passivation layer 28 as represented in FIG. 2J. The passivation layer 28 may be constructed from a plurality of sublayers. An oxide layer may for example be applied first, which serves as an adhesion promoter for the subsequently applied nitride layer. The passivation layer 28 is deposited, for example, by using a CVD or PECVD method.

If the region in which the metallization of the conductor track 11 has been thinned is intended to be formed as a laser fuse-memory element, then it is advantageous to open the passivation layer 28 in this region. This makes it possible to melt the metallization layer 21 fully or at least partially with a laser beam when programming the laser fuse-memory element.

In order to open the passivation layer 28, for example with the aid of a photolithographic method process, a mask of photoresist is applied onto the passivation layer 28 and the passivation layer 28 is subsequently removed by a dry etching method in the thinned region. A laser fuse-memory element having a passivation layer 28 opened in the thinned metallization region is illustrated in FIG. 2K.

If the metallization region thinned by using the wet chemical etching process is intended to be formed as a passive resistor element, then the resistance of the conductor track 11 in this region depends on the dimensions of the thinned region as well as the conductor track material.

Both when forming the thinned metallization region as a fuse element, as a fuse-memory element or as a resistor element, the lateral extent of the thinned region is determined by the size of the opening of the hard mask 26, through which the metallization layer 23 is etched. The opening of the hard mask 26 is preferably smaller than 10, 9, 8, 7, 6, 5, 4, 3, 2 or 1 µm along the principal direction of the conductor track 11. The thinning of the metallization advantageously extends over the entire width of the conductor track 11. The width of the conductor track 11 is for example 2.5 µm or 2.8 µm or 3.5 µm or 4.0 µm or 5.0 µm. As an alternative, the width of the conductor track 11 may, for example, take another value in the range of from 2.5 µm to 5.0 µm.

Provision may be made for the conductor track 11 to have a smaller width in the region in which the fuse-memory element or the resistor element is intended to be made, than in the adjoining regions of the conductor track 11. As an alternative, provision may be made for the conductor track 11 to have the same width in the region intended for the fuse-memory element or the resistor element as in the neighboring regions.

The thickness of the metallization layer 21 is, for example, 100 nm or 200 nm or 300 nm or 400 nm or 500 nm or has, for example, a value lying between the specified values. The metallization layer 23 has, for example, a thickness in the range of from 3 µm to 4 µm; for example, the thickness of the metallization layer 23 is 3.5 µm.

The thickness of the metallization layers 21 and 23, the width of the conductor track 11 and the opening of the hard mask 26 along the principal direction of the conductor track 11 will be selected according to the intended application. If the thinned metallization region is intended to be formed as a resistor element, for example, then a desired resistance may be adjusted with the aid of the geometry of the thinned metallization region and the material of the metallization layer 21. If the thinned metallization region is intended to be used as a fuse element or electrical fuse-memory element, then the dimensions of the thinned metallization region and the materials for the metallization layers 21 and 23 may be selected so that the conductor track 11 melts in the thinned metallization region when a predetermined voltage is applied to the conductor track 11 or a predetermined current flows through the conductor track 11. Similar considerations apply for use of the thinned metallization region as a laser fuse-memory element. In this case as well, the geometry of the material of the thinned metallization region will be selected so that this region can be melted by a predetermined laser beam.

A hard mask 26 produced for example from a nitride or oxynitride material has the advantage compared with other masks, for example a mask produced from photoresist, that the hard mask 26 is mechanically more stable and adheres better on the underlying layer than other masks do. Since this prevents the liquid etchant from penetrating between the hard mask 26 and the underlying layer, with comparatively small mask openings of from 10 to less than 1 µm, it is possible to etch highly defined small regions such as those required for fuse-memory elements or resistor elements.

The good adhesion properties of the hard mask 26 also have an advantageous effect in relation to the side walls of the conductor track 11 (cf. FIG. 2F). The hard mask 26 prevents the liquid etchant from seeping through between the hard mask 26 and the etch stop layer 22 and attacking the metallization layer 21 lying below the etch stop layer 22.

In so far as the description of the claims of the present patent application refer to one layer being applied or deposited onto another layer or arranged on the other layer, these and similar formulations do not necessarily mean that the two layers are in direct contact with one another. Rather, these formulations do not preclude there also being one or more layers between the two layers.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A method for producing an integrated circuit including a component, comprising:
   applying a first metallization layer at least locally onto a substrate, the first metallization layer having a bottom surface on the substrate, an opposing top surface, and side face;
   applying a second metallization layer onto the first metallization layer, the second metallization layer having a bottom surface on the top surface of the first metallization layer, an opposing top surface, and side faces;
   applying a hard mask directly onto the top surface of the second metallization layer and directly onto at least the side faces of the first and second metallization layers;
   opening the hard mask to expose a portion of the top surface of the second metallization layer and wet chemically etching the second metallization layer by using the hard mask, wherein remaining portions of the hard mask cover the side faces of the first and second metallization layers during the wet chemically etching.

2. The method of claim 1, wherein the hard mask comprises a nitride material or an oxynitride material.

3. The method of claim 1, comprising wherein the fuse-memory element is an electrical fuse-memory element or a laser fuse-memory element.

4. The method of claim 1, comprising:
   where the fuse element is a memory element.

5. The method of claim 1, comprising:
   where the fuse element is a resistor element.

6. The method of claim 1, comprising depositing the mask layer by using a PECVD method.

7. The method of claim 1, comprising wherein an opening of the hard mask, through which the at least one metallization layer is etched, is smaller than 10 µm or 9 µm or 8 µm or 7 µm or 6 µm or 5 µm or 4 µm or 3 µm or 2 µm or 1 µm in one direction.

8. The method of claim 7, comprising wherein the direction is the current flow direction of a current through a fuse element, a fuse-memory element or a resistor element.

9. A method, comprising:

applying a first metallization layer at least locally onto a substrate, the first metallization layer having a first major surface on the substrate, an opposing second major surface, and side faces;

applying an etch stop layer onto the first metallization layer, the etch stop layer having a first major surface on the second major surface of the first metallization layer, an opposing second major surface, and side faces;

applying a second metallization layer onto the etch stop layer, the second metallization layer having a first major surface on the second major surface of the etch stop layer, an opposing second major surface, and side faces;

applying a hard mask onto directly onto the second major surface of the second metallization layer and directly onto the side faces of the first and second metallization layers; and removing the second metallization layer in a region of at least one opening of the hard mask along the second major of the second metallization layer by using a wet chemical etching method, the side faces of the first and second metallization layers being covered by the hard mask during the wet chemical etching.

10. The method of claim 9, comprising wherein the at least one opening of the hard mask is smaller than 10 μm or 9 μm or 8 μm or 7 μm or 6 μm or 5 μm or 4 μm or 3 μm or 2 μm or 1 μm in a first direction.

11. The method of claim 9, comprising wherein the first metallization layer forms a fuse element or an electrical fuse-memory element or a laser fuse-memory element in a region in which the second metallization layer has been removed.

12. The method of claim 9, comprising wherein the first metallization layer forms a resistor element in a region in which the second metallization layer has been removed.

13. The method of claim 10, comprising wherein the first direction is the current flow direction of a current through the fuse element or the fuse-memory element or the resistor element.

14. The method of claim 1, comprising wherein the hard mask covers the upper side and the side walls of the conductor track.

15. The method of claim 1, comprising:

applying an etch stop layer onto the first metallization layer before applying the second metallization layer; and applying the second metallization layer onto the etch stop layer, wherein the etch stop layer and the hard mask prevent the etchant from reaching the first metallization layer.

16. The method of claim 1, including forming a fuse element in a region of the first metallization layer where the second metallization layer has been etched.

17. The method of claim 1, wherein the first metallization layer is applied directly onto the substrate.

* * * * *